United States Patent [19]

Mori et al.

[11] Patent Number: 4,510,622
[45] Date of Patent: Apr. 9, 1985

[54] HIGH SENSITIVITY MILLIMETER-WAVE MEASUREMENT APPARATUS

[75] Inventors: Tsutomu T. Mori, Gardena; Robert B. Dybdal, Palos Verdes Estates, both of Calif.; Robert D. Etcheverry, Hawthorne, Calif., by Nancy Etcheverry, guardian

[73] Assignee: The United States of America as represented by the Secretary of the Air Force, Washington, D.C.

[21] Appl. No.: 388,327

[22] Filed: Jun. 14, 1982

[51] Int. Cl.³ .............................................. H04B 17/00
[52] U.S. Cl. ........................................ 455/67; 455/75; 455/86; 343/6.8 R; 343/7 PL
[58] Field of Search ........................ 455/67, 75, 76, 84, 455/85, 86; 343/17.7, 703, 5 AF, 6.8 R, 6.8 LC, 7 A, 7 PL

[56] References Cited

U.S. PATENT DOCUMENTS 3,935,533  1/1976  Amoroso, Jr. ...................... 455/75
4,361,904  11/1982  Matsumura ........................ 455/67

Primary Examiner—Jin F. Ng
Attorney, Agent, or Firm—Donald J. Singer; William Stepanishen

[57] ABSTRACT

A millimeter wave measurement apparatus utilizing a phase-locked transmitter to generate a millimeter wave signal and a phase-locked local oscillator receiver to receive the transmitted millimeter wave signal. A conventional microwave receiver unit receives the IF signal from the millimeter wave receiver and downconverts the IF signal for detection and measurement.

4 Claims, 4 Drawing Figures

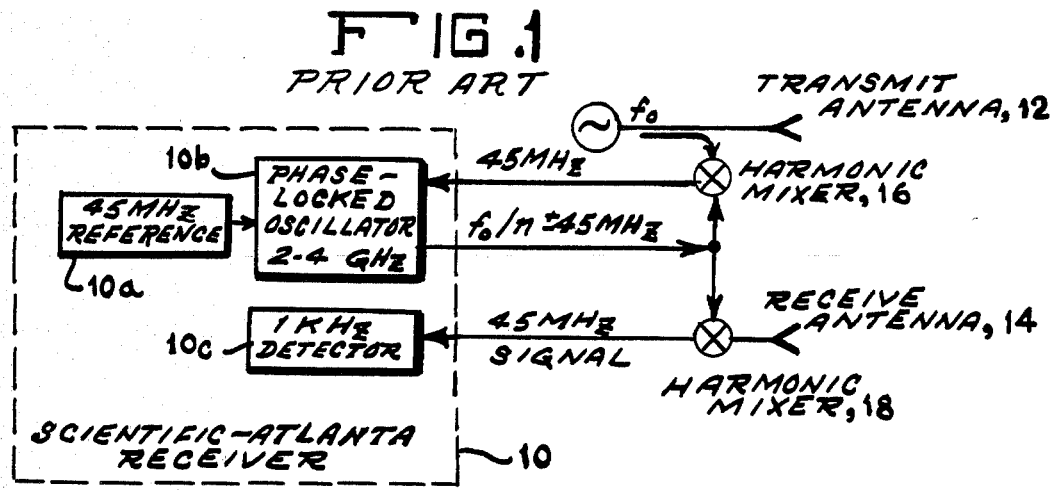
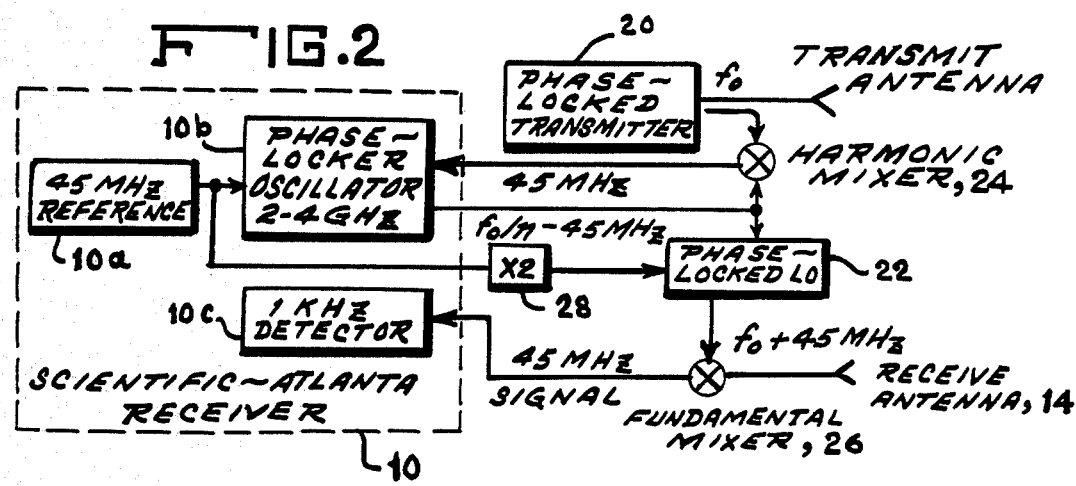
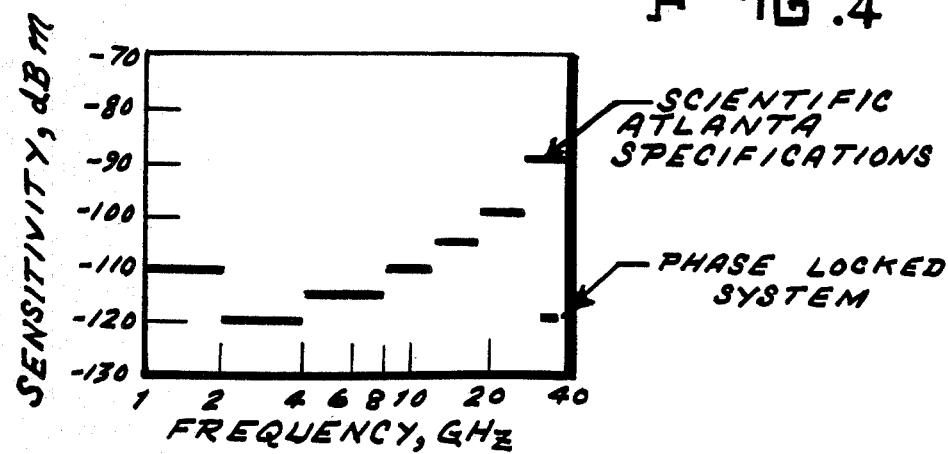

HIGH SENSITIVITY MILLIMETER-WAVE MEASUREMENT APPARATUS

STATEMENT OF GOVERNMENT INTEREST

The invention described herein may be manufactured and used by or for the Government for governmental purposes without the payment of any royalty thereon.

BACKGROUND OF THE INVENTION

The present invention relates broadly to R.F. measurement instrumentation, and in particular, to a high sensitivity millimeter-wave measurement apparatus.

In recent years an increased interest in millimeter-wave systems has developed. As component technology matures, significant efforts are being made to exploit the advantages that this spectral regime offers. As millimeter systems evolve, instrumentation and measurement techniques for system evaluation should also be developed. The problem with the existing millimeter-wave measuring instrumentation is that the receiver noise level increases with frequency. One alternative solution is to increase the transmit power. However, significant transmitter power increases are very expensive and increase the potential for radiation hazards. A second alternative approach to measuring millimeter-waves is to reduce the noise level in the receiver unit in the measuring apparatus. The instrumentation measurement apparatus system described in this application was developed to measure antennas and radar targets with the same sensitivity available at microwave frequencies.

SUMMARY OF THE INVENTION

The present invention utilizes a phase-locked transmitter and a phase-locked local oscillator in a receiver unit to provide an increased measurement sensitivity of millimeter-waves in an RF measurement receiver which uses a harmonic mixing technique to extend the frequency coverage of the microwave receiver into the millimeter range.

It is one object of the present invention, therefore, to provide an improved high sensitivity millimeter-wave measurement apparatus.

It is another object of the present invention to provide an improved high sensitivity millimeter-wave measurement apparatus for the recovery of the sensitivity loss which is associated with harmonic mixing techniques that are conventionally used to extend frequency coverage of these receivers.

It is a further object of the present invention to provide an improved high sensitivity millimeter-wave measurement apparatus to utilize fundamental signal mixing to measure millimeter waves.

It is yet another object of the present invention to provide an improved high sensitivity millimeter-wave measurement apparatus utilizing a phase locked transmitter and a phase locked local oscillator to maintain a constant IF frequency when the transmitted frequency varies.

These and other advantages, objects and features of the invention will become more apparent after considering the following description taken in conjunction with the illustrative embodiment in the accompanying drawings.

BRIEF DESCRIPTION OF THE DRAWINGS

FIG. 1 is a block diagram of a conventional prior art millimeter wave measuring apparatus utilizing harmonic mixing techniques;

FIG. 2 is a block diagram of a high sensitivity millimeter wave measurement apparatus according to the present invention;

FIG. 4 is a graphical representation of the sensitivity performance of the high sensitivity millimeter wave measurement apparatus.

DESCRIPTION OF THE PREFERRED EMBODIMENT

Figure 3:
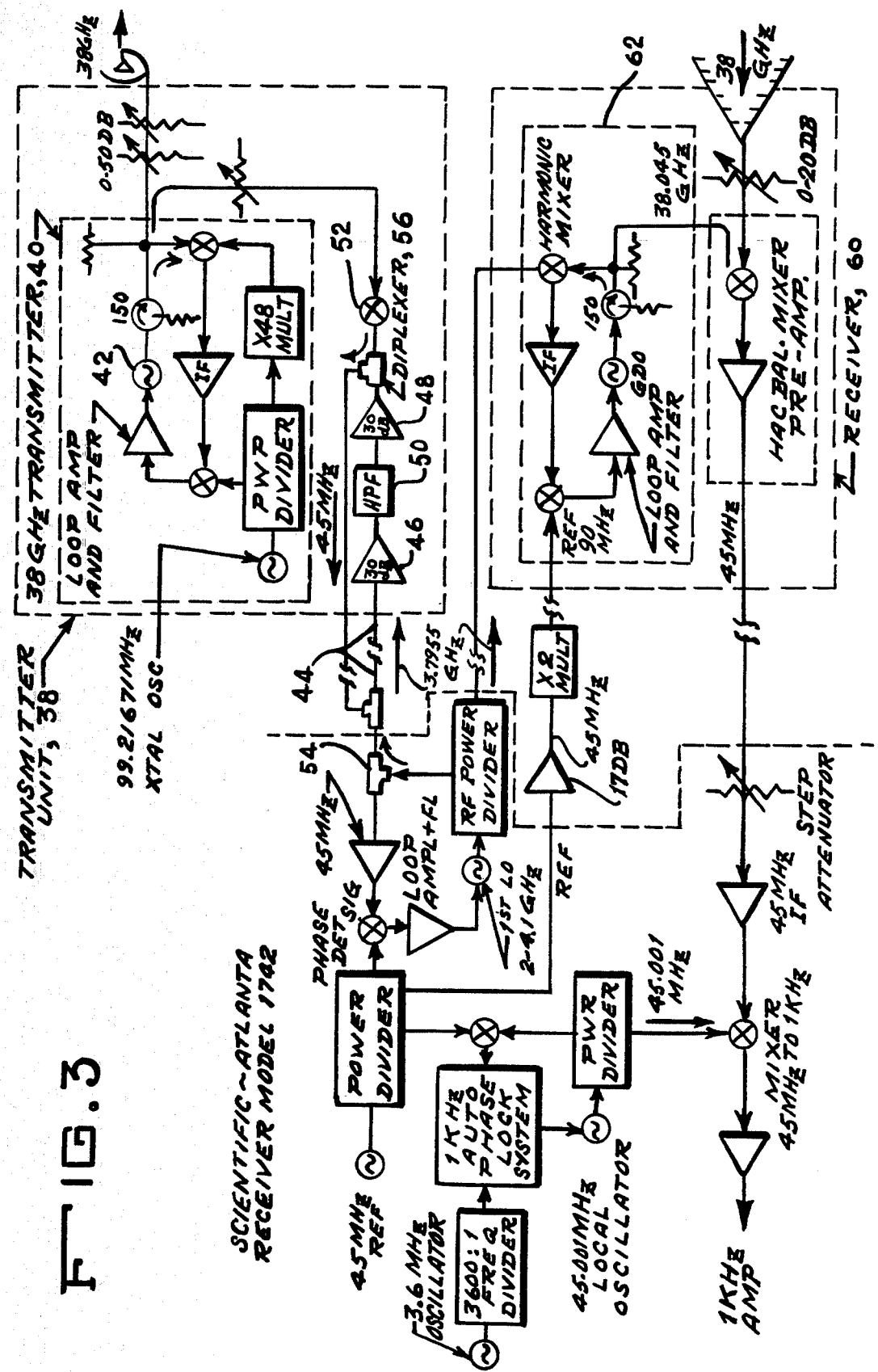
FIG. 3 is a block diagram illustrating in greater detail the high sensitivity millimeter wave measurement apparatus.

Referring now to FIG. 1, there is shown a block diagram of a conventional prior art millimeter wave measurement apparatus which utilizes harmonic mixing techniques. The conventional millimeter measurement apparatus uses a receiver unit 10 in conjunction with a transmit antenna 12 and a receive antenna 14 to measure millimeter waves. The receiver unit 10 which in the present example is shown as the commercially available Scientific-Atlanta receiver, comprises a 45 MHz reference signal generator 10a, a phase-locked oscillator unit 10b and a 1 KHz detector unit 10c. A pair of harmonic mixers 16, 18 are respectively connected between the receiver unit 10 and the transmit antenna 12 and the receive antenna 14.

The conventional millimeter wave measurement apparatus utilizes the operation of Scientific-Atlanta receiver with harmonic mixing techniques to measure millimeter waves. The fundamental frequency range of the receiver unit 10 is from 2 to 4 GHz. The transmitting frequency to the transmit antenna 12 is sampled by a harmonic mixer 16 and any variations in frequency are tracked by the internal phase-locked oscillator unit 10b to provide a local oscillator signal that is fed to the receiver harmonic mixer 18. The signal that is received at the receive antenna, 14 is harmonically mixed to produce a 45 MHz IF signal which is subsequently downconverted in the 1 KHz detector unit 10c for detection. The penalty for this simple frequency extension is the sensitivity loss which results from operation of the mixer in a harmonic rather than a fundamental mode. The loss in receiver sensitivity increases with frequency because the mixer is operated at higher harmonics at higher frequencies.

Turning now to FIG. 2, there is shown a high sensitivity millimeter wave measurement apparatus utilizing a Scientific-Atlanta receiver unit 10 in conjunction with a phase-locked transmitter unit 20 and a phase-locked local oscillator unit 22. The phase-locked oscillator 10b provides a signal to both the harmonic mixer 24 and the phase-locked local oscillator unit 22. The fundamental mixer unit 26 mixes signals from the phase-locked oscillator unit 22 with signals from the receive antenna, 14 and provides an output signal to the detector unit 10c.

In order to improve the sensitivity of the Scientific-Atlanta receiver unit 10, a fundamental mixer unit 26 was utilized in place of the harmonic mixer 18 (shown in FIG. 1). The circuit which is shown in FIG. 2 operates in the following manner. A phase-locked transmitter unit 20 is locked to an internal crystal oscillator which establishes the operating frequency of the transmitter. A phase-locked transmitter is required to achieve the necessary stability to maintain system lock. Any frequency deviations which may occur in the phase-locked transmitter are sampled by the harmonic mixer unit 24 and tracked by the internal phase-locked loop 10b in the Scientific-Atlanta receiver unit 10. The phase-locked oscillator 10b is also used as a reference for the receiver phase-locked local oscillator unit 22. In addition, the internal 45 MHz reference unit 10a is doubled by a times 2 multiplier unit 28 to provide a reference frequency to the receiver phase-locked local oscillator unit 22 which circuitry results in a local oscillator frequency 45 MHz higher than the transmitter frequency. This local oscillator frequency was selected so that any variations in the transmitter frequency would be tracked in the same direction by the receiver local oscillator phase-locked unit 10b to maintain a 45 MHz IF frequency; e.g., if the transmit frequency increases, the local oscillator frequency also increases to maintain a 45 MHz IF frequency.

In FIG. 3 there is a detailed block diagram which describes in greater detail the components of FIG. 2. A 1742 Scientific-Atlanta receiver is used without internal changes. The 38 GHz transmitter unit 40 uses a GDO (Gunn diode oscillator) unit 42 with a 100 mW output. In the present example, a 300 foot cable run 44 was required between the Scientific-Atlanta receiver and the transmitter unit 38. Two S-band amplifiers 46, 48 which are separated by a high pass filter unit 50, compensate the cable losses so that an adequate power level was delivered to the harmonic mixer unit 52 that monitors the transmitter frequency. Monitor tees 54, 56 provide an expedient method of diplexing the S-band signal and the 45 MHz return signal. This system operates on the 10th harmonic, i.e., n=10 in FIG. 2.

In the receiver unit 60, a phase-locked local oscillator unit 62 operates at 38.045 GHz and provides a 10 mW local oscillator output which is 45 MHz higher than the transmitted frequency. It should be noted that adequate isolation between the 45 MHz reference oscillator, which is doubled for the phase-locked LO loop, and the 45 MHz IF input signal from the fundamental mixer is required, otherwise 45 MHz leakage components may appear as false signals in the receiver output. The 45 MHz input signal from the fundamental mixer unit is downconverted in the receiver unit 45 MHz to 1 KHz for subsequent detection and applied to the pen amplifier and antenna recorder unit for recording display.

The Scientific-Atlanta sensitivity specifications are based on a 12 dB signal/noise ratio at the receiver output and are presented in FIG. 4. The degradation in sensitivity for the conventional operation as the frequency and harmonic number increase is apparent. The phase-locked system provides a −120.5 dBm sensitivity with a 12 dB signal/noise ratio as determined from measurements on a pattern range. The system provides a 30 dB improvement in sensitivity over the conventional receiver. Thus, it may be seen that the present apparatus for millimeter-wave antenna and radar scattering measurements is described which has a 30 dB sensitivity improvement over the conventional millimeter-wave operation of the Scientific-Atlanta receiver.

Although the invention has been described with reference to a particular embodiment, it will be understood to those skilled in the art that the invention is capable of a variety of alternative embodiments within the spirit and scope of the appended claims.

What is claimed is:

1. A high sensitivity millimeter wave measurement apparatus comprising in combination:
   means for transmitting a millimeter wave at a predetermined operating frequency, said transmitting means including a crystal oscillator to provide a phase-locked transmitter, said transmitting means providing a transmitter signal;
   means for receiving a millimeter wave, said receiving means including a phase-locked local oscillator and a fundamental mixer unit;
   a harmonic mixer unit operatively connected to said phase-locked transmitter to sample transmitter frequency deviations; and,
   a microwave receiver unit operatively connected to said harmonic mixer unit to receive said transmitter frequency deviations, said microwave receiver unit including a phase-locked oscillator to track said transmitter frequency deviations, said phase-locked oscillator providing a reference signal to both said harmonic mixer unit and said phase-locked local oscillator of said receiving means, said microwave receiver unit generating an internal 45 MHz reference signal, said 45 MHz reference signal being applied to said phase-locked oscillator in said microwave receiver unit, said 45 MHz reference signal being doubled by a times 2 multiplier unit and applied as a reference signal to said phase-locked local oscillator in said receiving means, said phase-locked local oscillator providing a local oscillator signal to said fundamental mixer unit, said receiving means receiving and applying said millimeter wave to said fundamental mixer unit, said fundamental mixer unit mixing said local oscillator signal and said said millimeter wave to provide a first IF signal to said microwave receiver unit for detection and measurement.

2. A millimeter wave measurement apparatus as described in claim 1 wherein said local oscillator signal comprises said transmitter signal plus 45 MHz.

3. A millimeter wave measurement apparatus as described in claim 1 wherein said first IF signal comprises 45 MHz.

4. A millimeter wave measurement apparatus as described in claim 1 wherein said microwave receiver unit includes a 1 KHz detector unit wherein said first IF signal is downconverted to a 1 KHz signal.

* * * * *